(12) United States Patent
Zhang

(10) Patent No.: US 10,818,513 B2
(45) Date of Patent: Oct. 27, 2020

(54) METHOD FOR MANUFACTURING CONDUCTIVE LINE

(71) Applicant: Wuhan China Star Optoelectronics Semiconductor Display Technology Co., Ltd., Wuhan (CN)

(72) Inventor: Pengbin Zhang, Wuhan (CN)

(73) Assignee: Wuhan China Star Optoelectronics Semiconductor Display Co., Ltd., Wuhan (CN)

(*) Notice: Subject to any disclaimer, the term of this patent is extended or adjusted under 35 U.S.C. 154(b) by 9 days.

(21) Appl. No.: 16/470,255

(22) PCT Filed: Nov. 14, 2018

(86) PCT No.: PCT/CN2018/115415
§ 371 (c)(1),
(2) Date: Jun. 17, 2019

(87) PCT Pub. No.: WO2020/034466
PCT Pub. Date: Feb. 20, 2020

(65) Prior Publication Data
US 2020/0194279 A1 Jun. 18, 2020

(30) Foreign Application Priority Data
Aug. 16, 2018 (CN) .......................... 2018 1 0935930

(51) Int. Cl.
H01L 21/3213 (2006.01)
H01L 27/12 (2006.01)
H01L 27/32 (2006.01)

(52) U.S. Cl.
CPC ...... *H01L 21/32138* (2013.01); *H01L 27/124* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 7,351,663 B1* | 4/2008 | Kabansky | H01L 21/02071 438/706 |
| 2006/0137710 A1* | 6/2006 | Lim | B08B 7/0035 134/1.1 |
| 2016/0079088 A1* | 3/2016 | Agarwal | H01L 21/32139 438/734 |
| 2018/0053788 A1* | 2/2018 | Lee | H01L 21/32138 |
| 2019/0109009 A1* | 4/2019 | Longrie | H01L 21/30655 |
| 2020/0135459 A1* | 4/2020 | Jiang | H01L 21/67017 |

FOREIGN PATENT DOCUMENTS

| | | |
|---|---|---|
| CN | 104599962 | 5/2015 |
| CN | 108400090 | 8/2018 |
| JP | 2000-012514 | 1/2000 |

\* cited by examiner

*Primary Examiner* — Evren Seven

(57) ABSTRACT

The present disclosure provides a method for manufacturing a conductive line. The method includes steps of providing a substrate; forming a metal layer on the substrate; patterning the metal layer by etching a portion of the metal layer; and performing a post-treatment process on the patterned metal layer in a chamber by injecting a $C_xH_yF_z$ gas and water vapor into the chamber, such that the patterned metal layer avoids from being corroded after the post-treatment process is performed.

19 Claims, 2 Drawing Sheets

METHOD FOR MANUFACTURING CONDUCTIVE LINE

RELATED APPLICATIONS

This application is a National Phase of PCT Patent Application No. PCT/CN2018/115415 having International filing date of Nov. 14, 2018, which claims the benefit of priority of Chinese Patent Application No. 201810935930.4 filed on Aug. 16, 2018. The contents of the above applications are all incorporated by reference as if fully set forth herein in their entirety.

FIELD AND BACKGROUND OF THE INVENTION

The present disclosure relates to the field of conductive lines, and more particularly to and a method for manufacturing a conductive line.

Generally, for forming conductive lines (such as forming the driving circuits configured to drive source electrode or drain electrode on LTPS array substrate or AMOLED array substrate), a titanium/aluminum/titanium (Ti/Al/Ti) layer is deposited first on substrate, and then the Ti/Al/Ti layer is patterned using chlorine gas ($Cl_2$) to etch a portion of the Ti/Al/Ti layer.

After the Ti/Al/Ti layer is patterned using chlorine gas ($Cl_2$), Cl and Al usually attach to a surface of the Ti/Al/Ti layer in form of AlClx (mainly $AlCl_3$). It is known that, in case $AlCl_3$ attached to the surface of Ti/Al/Ti layer contacts water existing in air or atmosphere, the Ti/Al/Ti layer will be corroded.

The above-mentioned process involves chemical reactions as below.

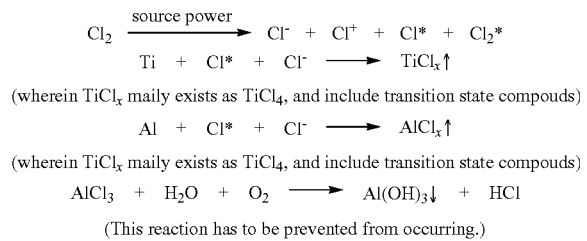

(wherein $TiCl_x$ maily exists as $TiCl_4$, and include transition state compounds)

(wherein $TiCl_x$ maily exists as $TiCl_4$, and include transition state compounds)

(This reaction has to be prevented from occurring.)

Therefore, according to prior art, there is usually an after-treatment (AT) process performed immediately on the patterned Ti/Al/Ti layer after Ti/Al/Ti layer is patterned, in order to prevent the chemical reaction, $AlCl_3+H_2O+O_2 \rightarrow Al(OH)_3\downarrow+HCl$, from occurring. Such AT process is performed by injecting $CF_4$ and $O_2$ into etching chamber while source power is applied to the etching chamber.

The above-mentioned process involves chemical reactions as below.

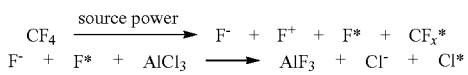

$AlCl_3$ is a molecular crystal, and could be easily dissolved in water (solubility: 45.8 g/100 mL in water). $AlF_3$ is an ionic crystal, and is difficult to be dissolved in water. With chemical reaction $F^-+F^*+AlCl_3 \rightarrow AlF_3+Cl^-+Cl^*$, Al can avoid from being corroded.

However, C—F bond in compound $CF_4$ is valance bond and bonding strength between C and F is very strong, and thus extreme high energy is required to break C—F bond. That is, if $CF_4$ is intended to be decomposed and dissociated, an extreme high source power (about 15000 watts) has to be applied to etching chamber. This consumes a lot or electric power and energy. In the meantime, to provide enough amount of F* to ensure occurrence of AT process, high flow rate of $CF_4$ should be introduced into etching chamber. This undoubtedly increases manufacturing cost for forming conductive lines. Otherwise, Al cannot effectively avoid from being corroded.

Therefore, there is a need to provide a method for manufacturing a conductive line, in order to solve above-said problems existing in prior art.

SUMMARY OF THE INVENTION

The present disclosure provides a method for manufacturing a conductive line, which solve the problem existing in the prior art where aluminum cannot effectively avoid from being corroded and manufacturing cost for forming conductive line is high.

To solve the aforementioned problems, the present disclosure provides a method for manufacturing a conductive line, comprising steps of:

providing a substrate;

forming a metal layer on the substrate;

patterning the metal layer by etching a portion of the metal layer; and performing a post-treatment process on the patterned metal layer in a chamber by injecting a $C_xH_yF_z$ gas and water vapor into the chamber, such that the patterned metal layer avoids from being corroded after the post-treatment process is performed;

wherein the post-treatment process comprises steps of:
injecting the $C_xH_yF_z$ gas and water vapor into the chamber; and decomposing and dissociating the $C_xH_yF_z$ gas and water vapor to have the decomposed and dissociated $C_xH_yF_z$ gas and water vapor react with the patterned metal layer.

In accordance with one embodiment of the present disclosure, the metal layer is a titanium/aluminum/titanium layer.

In accordance with one embodiment of the present disclosure, a chorine gas is used to etch the portion of the metal layer.

In accordance with one embodiment of the present disclosure, the chamber is an etching chamber.

In accordance with one embodiment of the present disclosure, the $C_xH_yF_z$ gas is $CHF_3$, $C_2HF_5$, $C_3F_8$, or $C_4F_8$.

In accordance with one embodiment of the present disclosure, after the post-treatment process is performed, the patterned metal layer has a smooth sidewall that is not recessed inwardly.

In accordance with one embodiment of the present disclosure, the post-treatment process is performed in the chamber at a source power between 6000 watts to 10000 watts.

In accordance with one embodiment of the present disclosure, the substrate is a low temperature polysilicon (LTPS) array substrate or an active matrix organic light emitting diode (AMOLED) array substrate.

In accordance with one embodiment of the present disclosure, the conductive line is a driving circuit configured to drive a source electrode or a drain electrode on the LTPS array substrate or the AMOLED array substrate.

The present disclosure further provides a method for manufacturing a conductive line, comprising steps of:
  providing a substrate;
  forming a metal layer on the substrate;
  patterning the metal layer by etching a portion of the metal layer; and
  performing a post-treatment process on the patterned metal layer in a chamber by injecting a $C_xH_yF_z$, gas and water vapor into the chamber, such that the patterned metal layer avoids from being corroded after the post-treatment process is performed.

In accordance with one embodiment of the present disclosure, the metal layer is a titanium/aluminum/titanium layer.

In accordance with one embodiment of the present disclosure, a chorine gas is used to etch the portion of the metal layer.

In accordance with one embodiment of the present disclosure, the chamber is an etching chamber.

In accordance with one embodiment of the present disclosure, the post-treatment process comprises steps of:
  injecting the $C_xH_yF_z$, gas and water vapor into the chamber; and
  decomposing and dissociating the $C_xH_yF_z$, gas and water vapor to have the decomposed and dissociated $C_xH_yF_z$, gas and water vapor react with the patterned metal layer, such that the patterned metal layer avoids from being corroded after the post-treatment process is performed.

In accordance with one embodiment of the present disclosure, the $C_xH_yF_z$ gas is $CHF_3$, $C_2HF_5$, $C_3F_8$, or $C_4F_8$.

In accordance with one embodiment of the present disclosure, after the post-treatment process is performed, the patterned metal layer has a smooth sidewall that is not recessed inwardly.

In accordance with one embodiment of the present disclosure, the post-treatment process is performed in the chamber at a source power between 6000 watts to 10000 watts.

In accordance with one embodiment of the present disclosure, the substrate is a low temperature polysilicon (LTPS) array substrate or an active matrix organic light emitting diode (AMOLED) array substrate.

In accordance with one embodiment of the present disclosure, the conductive line is a driving circuit configured to drive a source electrode or a drain electrode on the LTPS array substrate or the AMOLED array substrate.

Compared to the prior art, the present disclosure provides a method for manufacturing a conductive line, which uses $C_xH_yF_z$ gas and water vapor in the post-treatment process to provide enough amount of F*, H*, and O*, so that aluminum can avoid from being corroded. In addition, according to the present disclosure, the source power applied to the etching chamber for decomposing and dissociating $C_xH_yF_z$ gas and water vapor is much lower. Moreover, $C_xH_yF_z$ gas and water vapor used in the post-treatment process are inexpensive, remarkably lowering manufacturing cost for forming conductive line.

DETAILED DESCRIPTION OF SPECIFIC EMBODIMENTS OF THE INVENTION

Figure 1:
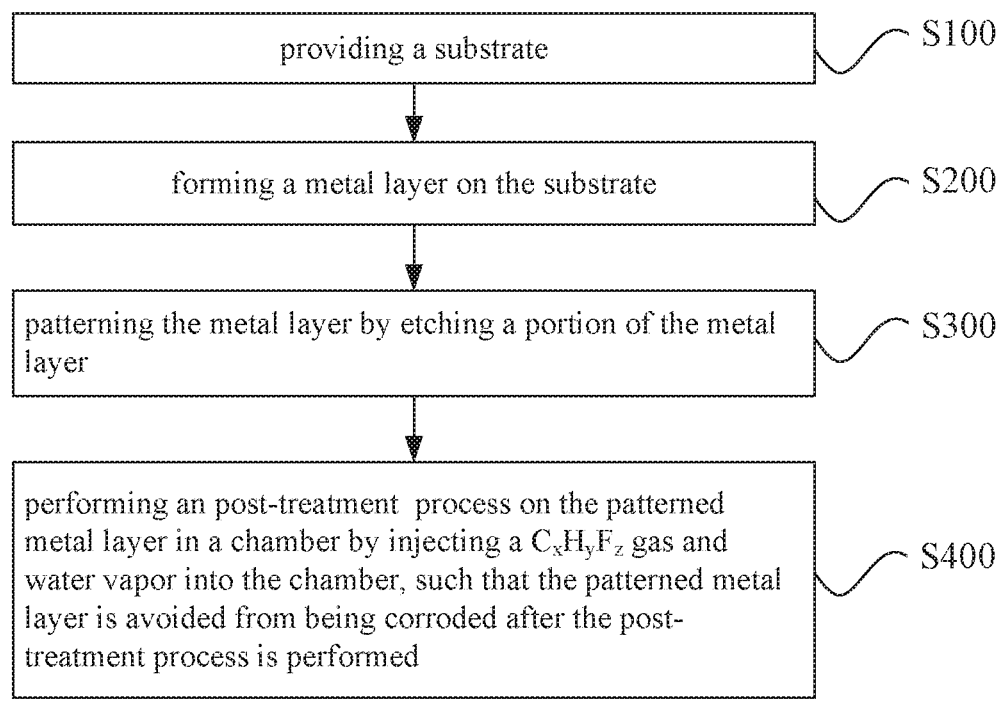
FIG. 1 shows a flowchart of a method for manufacturing a conductive line according to one preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Figure 2:
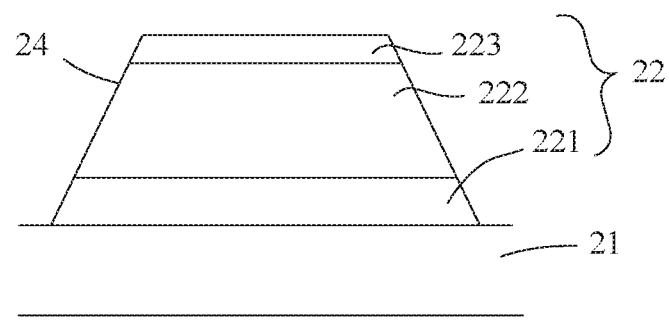
FIG. 2 shows a cross-sectional view of a conductive line manufactured according to the method of FIG. 1.

Please refer to FIGS. 1 and 2. FIG. 1 shows a flowchart of a method for manufacturing a conductive line according to one preferred embodiment of the present disclosure. FIG. 2 shows a cross-sectional view of a conductive line manufactured according to FIG. 1. The method provides by the present disclosure is to form a driving circuit configured to drive source electrode or drain electrode disposed on substrate of display devices, or to form other conductive lines having electrical connection function. As shown in FIGS. 1 and 2, the method provides by the present disclosure includes the following steps.

In a step S100, a substrate 21 is provided first.

Preferably, the substrate 21 is an array substrate. For example, the substrate 21 is a low temperature polysilicon (LTPS) array substrate or an active matrix organic light emitting diode (AMOLED) array substrate. However, the substrate of the present disclosure is not limited thereto. As long as the substrate could serve as a baseplate where the conductive line is formed, such substrate falls within scope that is intended to be protected by the present disclosure. The substrate 21 is could be made of polymer or other materials (such as polyimide).

Next, in a step S200, a metal layer 22 is formed on the substrate 21.

According to the present disclosure, the metal layer 22 includes an aluminum layer. In one preferred embodiment, the metal layer 22 is a titanium/aluminum/titanium (Ti/Al/Ti) layer. In other words, the metal layer 22 includes a titanium sublayer 221, an aluminum sublayer 222, and a titanium sublayer 223. The aluminum sublayer 222 is sandwiched between the titanium sublayer 221 and the titanium sublayer 223. In another preferred embodiment, the metal layer 22 only includes one aluminum layer.

Then, in a step S300, the metal layer 22 is patterned by etching a portion of the metal layer 22.

Preferably, a chorine gas is used to etch the portion of the metal layer 22.

Finally, in a step S400, a post-treatment process is performed on the patterned metal layer 22 in a chamber by injecting a $C_xH_yF_z$ gas and water vapor ($H_2O$) into the chamber, such that the patterned metal layer 22 avoids from being corroded after the post-treatment process is performed. Thus, manufacturing of the conductive line is completed.

In the present disclosure, the chamber is an etching chamber. The post-treatment process comprises steps of:
  injecting the $C_xH_yF_z$ gas and water vapor ($H_2O$) into the chamber; and
  decomposing and dissociating the $C_xH_yF_z$ gas and water vapor ($H_2O$) to have the decomposed and dissociated $C_xH_yF_z$ gas and water vapor react with the patterned metal layer 22, such that the patterned metal layer 22 avoids from being corroded after the post-treatment process is performed.

The $C_xH_yF_z$ gas is a fluorine-based hydrocarbon compound, such as $CHF_3$, $C_2HF_5$, $C_3F_8$, or $C_4F_8$.

The present disclosure is characterized in that, in the post-treatment process, $C_xH_yF_z$ gas and water vapor ($H_2O$) are used to replace $CF_4$ and $O_2$ and to function as source of F*, H*, and O*. Therefore, enough amount of F* can be provided to ensure occurrence of the chemical reaction, $F^-+F^*+AlCl_3 \rightarrow AlF_3+Cl^-+Cl^*$. In addition, enough amount of H* and O* are provided as well, where H* and O* would chemically combine with $Cl^-$ and $Cl^*$, so that the chemical reaction, $F^-+F^*+AlCl_3 \rightarrow AlF_3+Cl^-+Cl^*$, continues to proceed in the forward direction, and $Cl^*$ attached to surface of the metal layer could be removed outward, thus excellently avoiding aluminum from being corroded.

In addition, the present invention uses $C_xH_yF_z$ gas and water vapor ($H_2O$) in the post-treatment process to replace $CF_4$ and $O_2$ used in the after-treatment (AT) process of the prior art can have the advantage that bonding strength of C—F bond in $CHF_3$, $C_2HF_5$, $C_3F_8$, or $C_4F_8$ is much smaller than bonding strength of C—F bond in $CF_4$. Moreover, chemical bond of water vapor ($H_2O$) could be easily broken. Therefore, according to the present disclosure, the energy required to decompose and dissociate $C_xH_yF_z$ gas (including $CHF_3$, $C_2HF_5$, $C_3F_8$, $C_4F_8$, and etc.) and water vapor ($H_2O$) is very low. In other words, a much less source power is needed to be applied to the etching chamber. In accordance with one embodiment of the present disclosure, the post-treatment process is performed in the etching chamber at a source power between 6000 watts to 10000 watts.

Further, $C_xH_yF_z$ gas (including $CHF_3$, $C_2HF_5$, $C_3F_8$, $C_4F_8$, and etc.) and water vapor ($H_2O$) are inexpensive. With use of $C_xH_yF_z$ gas and water vapor, manufacturing cost for forming conductive line can be remarkably lowered.

As shown in FIG. 2, after the post-treatment process is performed, the patterned metal layer 22 has a smooth sidewall 24 that is not recessed inwardly.

Figure 3:
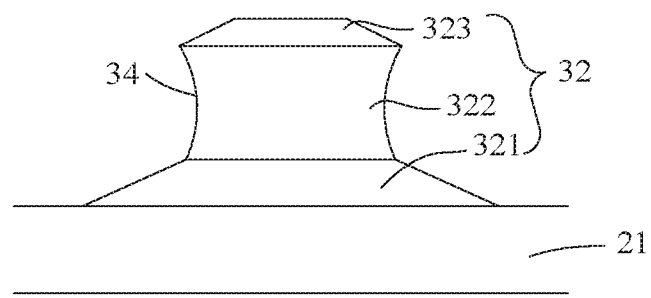
FIG. 3 shows a cross-sectional view of a conductive line manufactured without post-treatment process of the present disclosure being performed.

Please refer to FIG. 3. If the post-treatment process is not performed on the metal layer 32 (including a titanium sublayer 321, an aluminum sublayer 322, and a titanium sublayer 323), $Cl^*$ attached to surface of the aluminum sublayer 322 cannot removed, and the metal layer 32 will be corroded to have sidewall 34 of the metal layer 32 be recessed inwardly.

Compared to the prior art, the present disclosure provides a method for manufacturing a conductive line, which uses $C_xH_yF_z$ gas and water vapor in the post-treatment process to provide enough amount of F*, H*, and O*, so that aluminum can avoid from being corroded. In addition, according to the present disclosure, the source power applied to the etching chamber for decomposing and dissociating $C_xH_yF_z$ gas and water vapor is much lower. Moreover, $C_xH_yF_z$ gas and water vapor used in the post-treatment process are inexpensive, remarkably lowering manufacturing cost for forming conductive line.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a conductive line, comprising steps of:
   providing a substrate;
   forming a metal layer on the substrate;
   patterning the metal layer by etching a portion of the metal layer; and
   performing a post-treatment process on the patterned metal layer in a chamber by injecting a $C_xH_yF_z$ gas and water vapor into the chamber;
   wherein the post-treatment process comprises steps of:
   injecting the $C_xH_yF_z$ gas and water vapor into the chamber; and
   decomposing and dissociating the $C_xH_yF_z$ gas and water vapor to have the decomposed and dissociated $C_xH_yF_z$ gas and water vapor react with the patterned metal layer.

2. The method for manufacturing the conductive line according to claim 1, wherein the metal layer is a titanium/aluminum/titanium layer.

3. The method for manufacturing the conductive line according to claim 1, wherein a chorine gas is used to etch the portion of the metal layer.

4. The method for manufacturing the conductive line according to claim 1, wherein the chamber is an etching chamber.

5. The method for manufacturing the conductive line according to claim 1, wherein the $C_xH_yF_z$ gas is $CHF_3$, $C_2HF_5$, $C_3F_8$, or $C_4F_8$.

6. The method for manufacturing the conductive line according to claim 1, wherein after the post-treatment process is performed, the patterned metal layer has a smooth sidewall that is not recessed inwardly.

7. The method for manufacturing the conductive line according to claim 1, wherein the post-treatment process is performed in the chamber at a source power between 6000 watts to 10000 watts.

8. The method for manufacturing the conductive line according to claim 1, wherein the substrate is a low temperature polysilicon (LTPS) array substrate or an active matrix organic light emitting diode (AMOLED) array substrate.

9. The method for manufacturing the conductive line according to claim 8, wherein the conductive line is a driving circuit configured to drive a source electrode or a drain electrode on the LTPS array substrate or the AMOLED array substrate.

10. A method for manufacturing a conductive line, comprising steps of:
    providing a substrate;
    forming a metal layer on the substrate;
    patterning the metal layer by etching a portion of the metal layer; and
    performing a post-treatment process on the patterned metal layer in a chamber by injecting a $C_xH_yF_z$ gas and water vapor into the chamber.

11. The method for manufacturing the conductive line according to claim 10, wherein the metal layer is a titanium/aluminum/titanium layer.

12. The method for manufacturing the conductive line according to claim 10, wherein a chorine gas is used to etch the portion of the metal layer.

13. The method for manufacturing the conductive line according to claim 10, wherein the chamber is an etching chamber.

14. The method for manufacturing the conductive line according to claim 13, wherein the post-treatment process comprises steps of:

injecting the $C_xH_yF_z$ gas and water vapor into the chamber; and decomposing and dissociating the $C_xH_yF_z$ gas and water vapor to have the decomposed and dissociated $C_xH_yF_z$ gas and water vapor react with the patterned metal layer.

15. The method for manufacturing the conductive line according to claim 14, wherein the $C_xH_yF_z$ gas is $CHF_3$, $C_2HF_5$, $C_3F_8$, or $C_4F_8$.

16. The method for manufacturing the conductive line according to claim 10, wherein after the post-treatment process is performed, the patterned metal layer has a smooth sidewall that is not recessed inwardly.

17. The method for manufacturing the conductive line according to claim 10, wherein the post-treatment process is performed in the chamber at a source power between 6000 watts to 10000 watts.

18. The method for manufacturing the conductive line according to claim 10, wherein the substrate is a low temperature polysilicon (LTPS) array substrate or an active matrix organic light emitting diode (AMOLED) array substrate.

19. The method for manufacturing the conductive line according to claim 18, wherein the conductive line is a driving circuit configured to drive a source electrode or a drain electrode on the LTPS array substrate or the AMOLED array substrate.

* * * * *

UNITED STATES PATENT AND TRADEMARK OFFICE
CERTIFICATE OF CORRECTION

| | | |
|---|---|---|
| PATENT NO. | : 10,818,513 B2 | Page 1 of 1 |
| APPLICATION NO. | : 16/470255 | |
| DATED | : October 27, 2020 | |
| INVENTOR(S) | : Pengbin Zhang | |

It is certified that error appears in the above-identified patent and that said Letters Patent is hereby corrected as shown below:

On the Title Page

Item (73) Assignee:
"Wuhan China Star Optoelectronics Semiconductor Display Co., Ltd."
Should be changed to:
-- Wuhan China Star Optoelectronics Semiconductor Display Technology Co., Ltd. --

Signed and Sealed this
Second Day of February, 2021

Drew Hirshfeld
*Performing the Functions and Duties of the
Under Secretary of Commerce for Intellectual Property and
Director of the United States Patent and Trademark Office*